United States Patent
Shih

(10) Patent No.: US 7,557,025 B2
(45) Date of Patent: Jul. 7, 2009

(54) METHOD OF ETCHING A DIELECTRIC LAYER TO FORM A CONTACT HOLE AND A VIA HOLE AND DAMASCENE METHOD

(75) Inventor: Hui-Shen Shih, Chang-Hua Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 141 days.

(21) Appl. No.: 11/163,942

(22) Filed: Nov. 4, 2005

(65) Prior Publication Data

US 2007/0105386 A1  May 10, 2007

(51) Int. Cl.
*H01L 21/4763* (2006.01)

(52) U.S. Cl. .................. 438/592; 438/597; 438/618; 438/622; 438/694; 438/710; 257/E21.029; 257/E21.218; 257/E21.577; 257/E21.579; 257/E21.583

(58) Field of Classification Search .......... 438/637, 438/945, 625, 585, 706, 780, 629, 583, 942, 438/592, 597, 618–624, 636, 671, 694, 710, 438/711, 777; 257/E21.579, E21.577, E21.245, 257/E21.246, E21.249, E21.252, E21.24, 257/E21.029, 218, 577, 579, 583
See application file for complete search history.

(56) References Cited

U.S. PATENT DOCUMENTS

| | | | | |
|---|---|---|---|---|
| 5,117,276 A * | 5/1992 | Thomas et al. | ............... | 257/758 |
| 5,599,745 A * | 2/1997 | Reinberg | ............... | 438/624 |
| 5,702,566 A * | 12/1997 | Tsui | ............... | 438/694 |
| 5,767,013 A * | 6/1998 | Park et al. | ............... | 438/622 |
| 6,080,529 A * | 6/2000 | Ye et al. | ............... | 430/318 |
| 6,093,973 A * | 7/2000 | Ngo et al. | ............... | 257/797 |
| 6,136,679 A * | 10/2000 | Yu et al. | ............... | 438/592 |
| 6,156,640 A * | 12/2000 | Tsai et al. | ............... | 438/636 |
| 6,218,204 B1 * | 4/2001 | Hong et al. | ............... | 438/20 |
| 6,245,663 B1 * | 6/2001 | Zhao et al. | ............... | 438/622 |
| 6,340,603 B1 * | 1/2002 | Bell | ............... | 438/9 |
| 6,444,557 B1 * | 9/2002 | Biolsi et al. | ............... | 438/597 |
| 6,815,339 B2 | 11/2004 | Choi | | |
| 2001/0041444 A1 | 11/2001 | Shields et al. | | |
| 2003/0077897 A1 * | 4/2003 | Tsai et al. | ............... | 438/633 |
| 2004/0242005 A1 * | 12/2004 | Ying et al. | ............... | 438/691 |
| 2007/0072356 A1 * | 3/2007 | Shih et al. | ............... | 438/202 |

FOREIGN PATENT DOCUMENTS

| | | |
|---|---|---|
| CN | 1466190 A | 1/2004 |
| CN | 1485896A A | 3/2004 |
| TW | 313672 | 8/1997 |

OTHER PUBLICATIONS

Wei W.Lef., et al. "Inorganic ARC for 0.18μm and Sub-0.18μm Multilevel Metal Interconnect", IEEE Int. Interconnect Technol. Conf. Proc. pp. 84-86 (1998).

* cited by examiner

*Primary Examiner*—Michael S Lebentritt
(74) *Attorney, Agent, or Firm*—Winston Hsu

(57) ABSTRACT

A method of etching a dielectric layer by a conductive mask includes providing the dielectric layer on a substrate, forming a pattern conductive mask on the dielectric layer, the pattern conductive mask contacting with the substrate, processing a dry etching on the dielectric layer by the pattern conductive mask. Because the conductive mask disperses a lot of electric charges, the electric charges are not able to be stored on the dry etched dielectric layer, and the multilevel interconnects and the elements under the dielectric layer will not burst.

32 Claims, 5 Drawing Sheets

METHOD OF ETCHING A DIELECTRIC LAYER TO FORM A CONTACT HOLE AND A VIA HOLE AND DAMASCENE METHOD

BACKGROUND OF THE INVENTION

1. Field of the Invention

The present invention relates to an etching process with a conductive mask, more particular to, an etching process using a conductive mask to disperse electric charges caused from the dry etching process.

2. Description of the Prior Art

The semiconductor manufacture is more precise makes the integrated circuit has a revolution. The function and memory of the computer advance soon, and the peripheral industry develops, too. The semiconductor industry just likes Mor law forecasts the number of the transistor on the integrated circuit becomes double in eighteen months. So, the manufacture is more precise. The window process of the semiconductor was 0.18 mm in 1999, 0.13 mm in 2001, 90 nm in 2003 (0.09 mm), and now is 65 nm in 2005 (0.065 mm).

The contact plug and via plug always are the important technology in the semiconductor manufacture. The contact plug and via plug are able to electrically connect with the transistor, capacitor, the multilevel interconnects to form the whole integrated circuit. Except tungsten (W) and aluminum (Al) alloy can be the material of the contact plug and the via plug, the cooper process is a choice, too. When copper is the material of the multilevel interconnects, the via plug and the copper line need to be complete by the single damascene or the dual damascene, because copper can't be etched easily. But, the dry etching process of the contact hole, the via hole, or the trench causes a lot of electric charges on the dielectric layer. When the metal layer or the components almost are etched or already are etched, the metal layer under the dielectric layer or the components will burst, that causes the yield decreases.

Please refer to FIG. 1. FIG. 1 is a diagram of a metal layer bursts caused by an etching process in the prior art. As FIG. 1 shows, a semiconductor wafer 100 comprises a NMOS and a PMOS individually on the P well 102 and N well 104 of the P semiconductor substrate 101. A STI (shallow trench isolation) 106 surrounds NMOS and PMOS to divide each NMOS and PMOS. Each PMOS and NMOS comprises a gate 108, 109, and source/drain 110, 111 on the P well 102 and N well 104.

Then, a contact etch stop layer (CESL) 113, an undoped silica glass (USG) 112, and a phosphorus-doped silica glass (PSG) 114 are doped on P semiconductor substrate 101 and cover the gate 108, 109, source/drain 110, 111, STI 106, P well 102, and N well 104. For the multilevel interconnects electrically connect with the NMOS, PMOS, and other components, a contact plug 116 is formed by the lithograph process, the etching process, the doping process, and CMP. The one end of contact plug 116 contacts with the gate 108, or with the source/drain 110. The other end contacts with a metal layer 118. The metal layer 118 is patterned and is doped a dielectric layer 120. The dielectric layer 120 could comprise an HDP oxide 119 is formed by HDPCVD, a PE oxide 121 is formed by PECVD on the dielectric layer, and an cap oxide 123 on the an PB oxide 121, as the individual manufacture demands.

As FIG. 1 shows, a photoresist 122 is added on the dielectric layer 120, after PEP, the pattern photoresist 122 is produced, the dry etching process is performed to form a via hole 124 in the dielectric layer 120. In recently technology, the plasma dry etching process always applies with the via hole etching process. But, the dry etching process causes a lot of charges, and the charges store in the dielectric layer 120. So, when the via hole etching process almost or already etches till the metal layer 118 surface, the stored charges will lead off, and will cause the metal layer 118 to form a burst 125. Furthermore, the gate 108 or others component will burst.

So, how to avoid the via hole dry etching process is to induce the metal burst, which is an important issue in this domain.

SUMMARY OF THE INVENTION

The present invention relates to a method of an etching process with a conductive mask to solve the above-mentioned problem.

The present invention discloses a method of etching a dielectric layer comprising providing the dielectric layer on a substrate, forming a pattern conductive mask on the dielectric layer, the pattern conductive mask contacting with the substrate, processing a dry etching process on the dielectric layer by the pattern conductive mask.

The embodiment of the present invention is a method of forming a contact hole comprising providing a substrate, at least a component on the substrate, forming a dielectric layer on the component and the substrate, forming a conductive mask on the dielectric layer, the conductive mask contacting with the substrate, and processing an etching process with the conductive mask to etch a contact hole in the dielectric layer till the component surface.

The other embodiment of the present invention is a method of forming a via hole comprising providing a substrate, a first dielectric layer on the substrate, at least one multilevel interconnect layer, forming a second dielectric layer on the multilevel interconnects layer and the first dielectric layer, forming a pattern conductive mask on the second dielectric layer, the pattern conductive mask contacting with the substrate, and processing an etching process by the conductive mask to etch at least a via hole in the second dielectric layer till the multilevel interconnects layer surface.

The other embodiment of the present invention is a damascene method comprising providing a substrate, at least one conductive line on the substrate, forming a dielectric layer on the conductive line, forming a pattern conductive mask on the dielectric layer, the pattern conductive mask contacting with the substrate, processing an etching process by the pattern conductive mask to form at least one opening in the dielectric layer till the conductive line surface, and filling a copper into the opening.

The present invention uses the conductive mask to disperse the charges from the dry etching process into the big area conductive mask and to transmit the charges to the substrate. So, the charges will not be stored in the etched domain of the dielectric layer, the metal of the multilevel interconnects and the components will not burst, and the yield of the wafer will increases.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
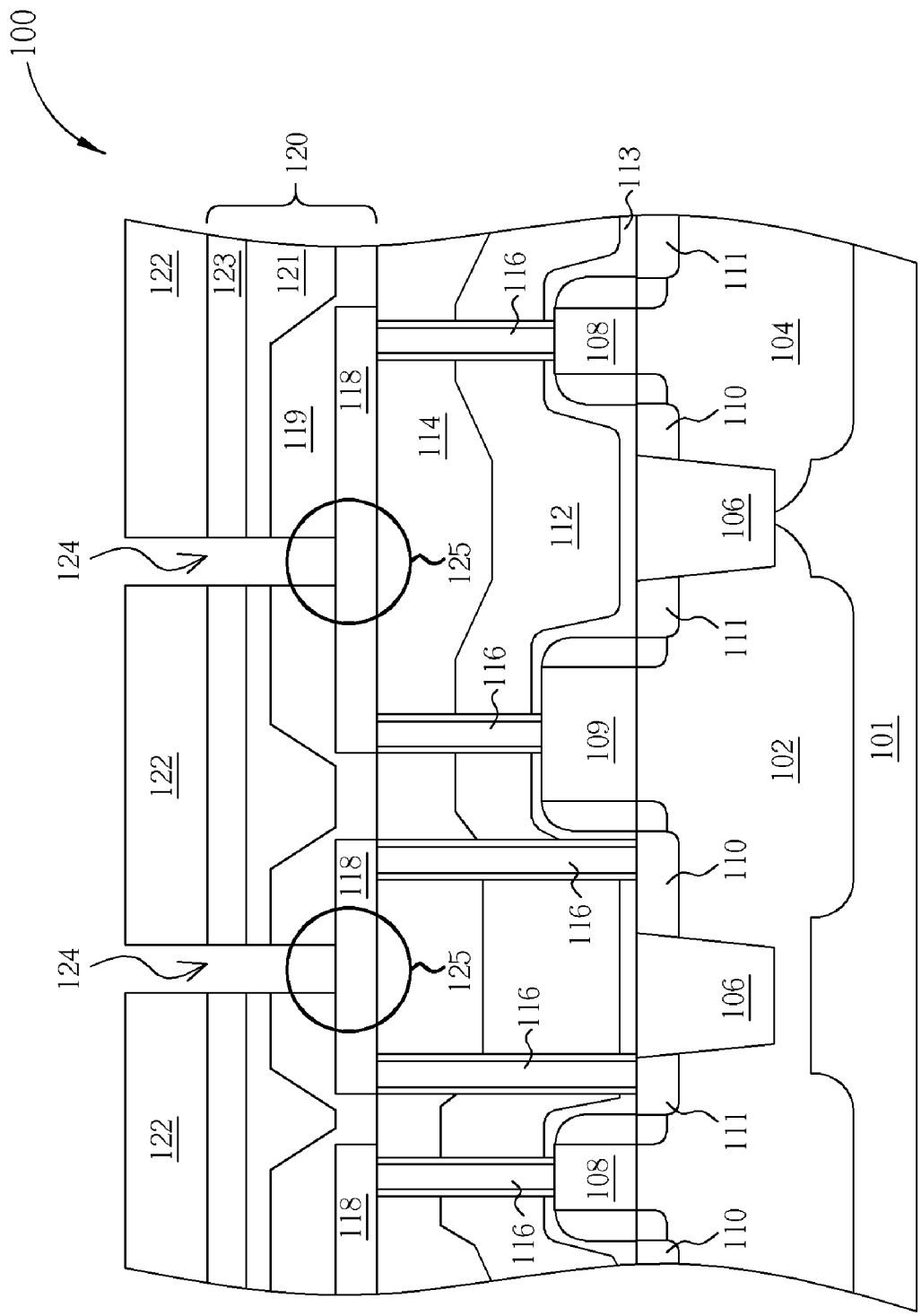
FIG. 1 is a diagram of a metal layer bursts causes by an etching process in the prior art.
Figure 2:
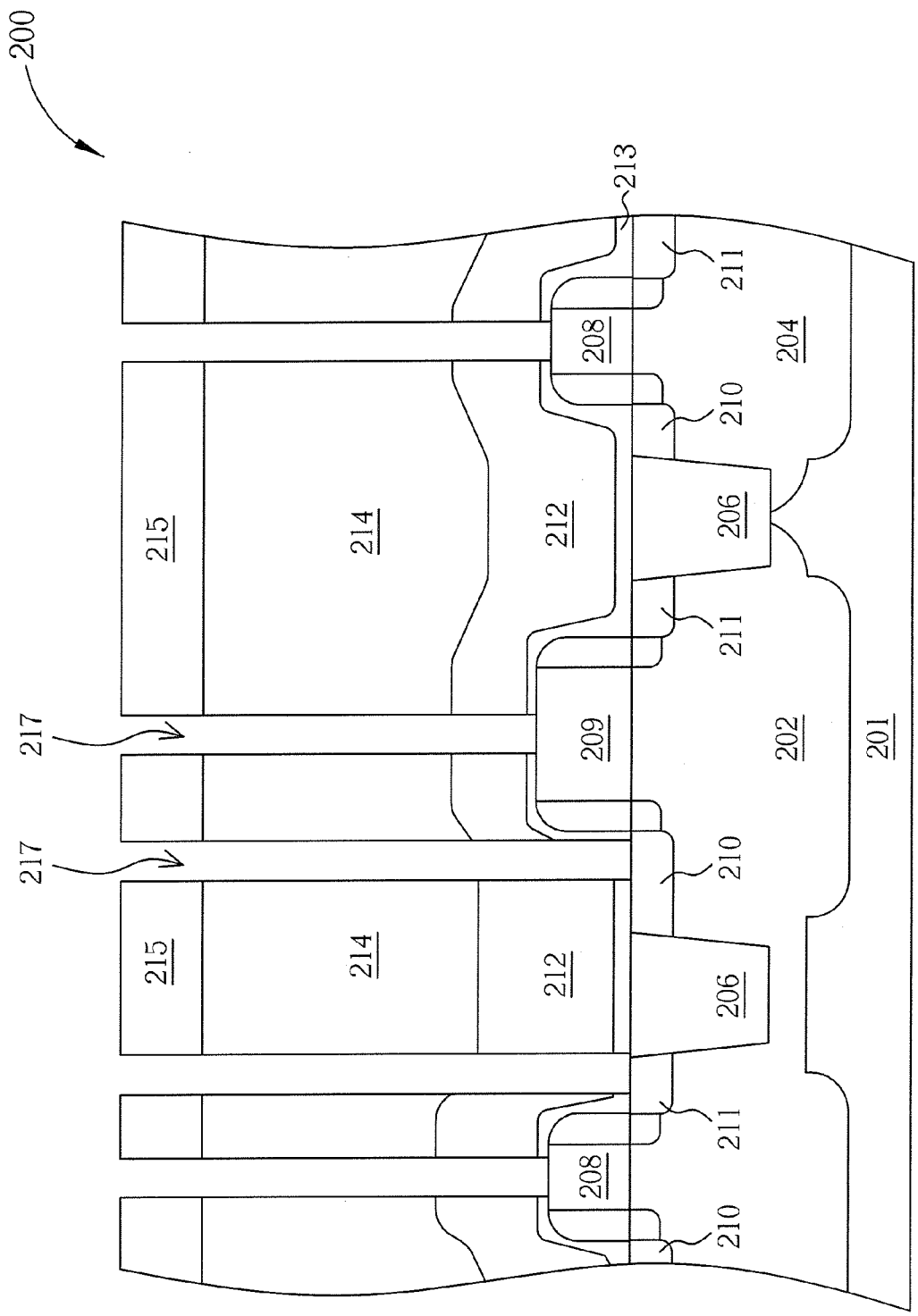
FIG. 2 is a diagram of the present invention applies with a contact hole etching process.

Please refer to FIG. 2. FIG. 2 is a diagram of the present invention applies with a contact hole etching process. A semiconductor wafer 200 comprises a NMOS and a PMOS individually on the P well 202 and N well 204 of the P semiconductor substrate 201. A STI 206 surrounds NMOS and PMOS to divide each NMOS and PMOS. Each PMOS and NMOS comprises a gate 208, 209, and source/drain 210, 211 on the P well 202 and N well 204.

Then, a contact etch stop layer (CESL) 213, an undoped silica glass (USG) 212, and a phosphorus-doped silica glass (PSG) 214 are doped on the P semiconductor substrate 201, and are covered the gate 208, 209, source/drain 210, 211, STI 206, P well 202, and N well 204. Next, a lithography process and a photo-lithography process are processed to form a pattern conductive mask 215 over PSG 214. The pattern conductive mask 215 is covered the edge of the semiconductor wafer 200 to contact with the P semiconductor substrate 201. Then, a contact hole 217 dry etching process is processed.

It is deserved to be mentioned, the conductive mask 215 is made by the conductive photoresist in this embodiment. The conductive mask is made by the conductive resin, the solvent, and sensitizer. For example, the conductive resin could be a 3-hexyl-thiophene-3thiophene-ethane-methacylate copolymer. The solvent could be an aceto-nitrile solution of gold chloride. The sensitizer could be gold chloride. Of course, the material of the conductive photoresist is not limit in the above materials, it depends on the manufacture process. An anti reflect coating (ARC) is formed on the PSG 214, then, the conductive mask 215 is formed. That can improve the photo-lithography process, and get better conductive mask 215 pattern. Furthermore, the pattern conductive mask 215 can be covered whole edge of the semiconductor wafer 200 or partial edge of the semiconductor wafer 200. No matter the pattern conductive mask 215 is covered whole edge or partial edge of the semiconductor wafer 200, the pattern conductive mask 215 can transmit the contact hole 217 dry etching process charges to the P semiconductor substrate 201.

Figure 3:
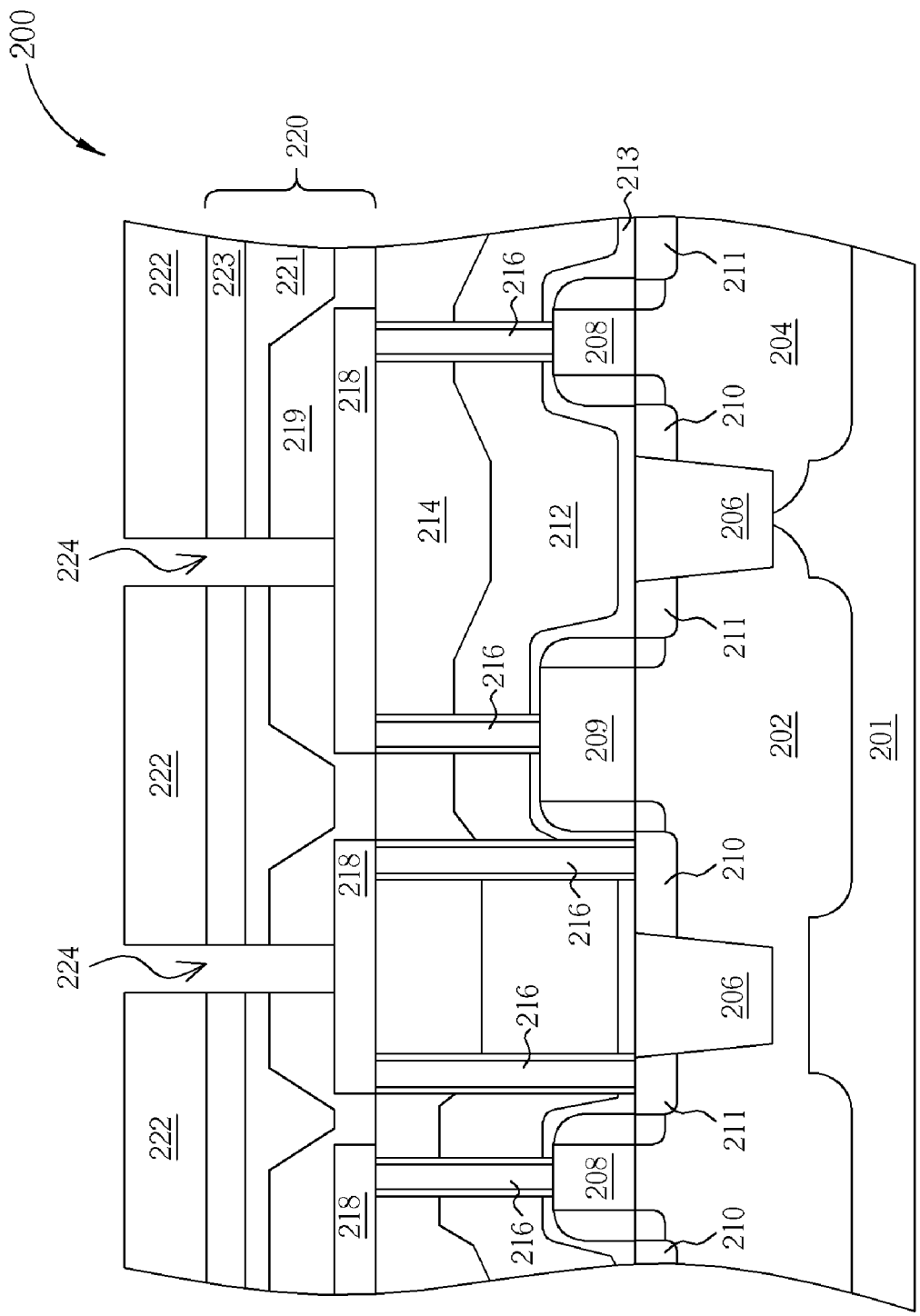
FIG. 3 is a diagram of the via hole etching process in the present invention.

The present invention could apply with the via hole etching process. Please refer to FIG. 3. FIG. 3 is a diagram of the via hole etching process in the present invention. It continues the semiconductor manufacture process of FIG. 2. When the contact hole 217 etching is completed, then, the conductive mask 215 is removed, a wash process is processed. That causes the contact hole 217 is formed in the USG 212 and PSG 214 till the gate 208, 209 surface or the source/drain 210, 211 surface. Next, metal Ta, TaN, or W is doped, and CMP is taken to form a contact plug 216. Then, doping process, lithograph process, and etching process are achieved to from an Al—Cu alloy pattern of the metal layer 218. The one end of the contact plug 216 contacts with the gate 208, or contact with the ion doped area, like source/drain 210. The other end contacts with the pattern metal layer 218 to form a multilevel interconnects layer. Then, doping a compound dielectric layer 220 depends on the demands. The dielectric layer 220 comprises a HDP oxide 219 is formed by a high density plasma doped process, an PE oxide 221 is formed by PECVD, and an cap oxide 223. Finally, the present invention forms a pattern conductive mask 222 on the dielectric layer 220. The pattern conductive mask 222 is covered the edge of the semiconductor wafer 200 to contact with the P semiconductor substrate 201. The via hole 224 dry etching process is processed to form the via hole 224 till the corresponding pattern metal layer 218 surface.

In the embodiment, the conductive mask 222 is a conductive photoresist. And, an anti reflect coating (ARC) is formed on the dielectric 220 depends the demands, then, the conductive mask 222 is formed. That can improve the photo-lithography process, and get better conductive mask 222 pattern. The pattern conductive mask 222 can be covered whole edge of the semiconductor wafer 200 or partial edge of the semiconductor wafer 200 to transmit the via hole 224 dry etching process charges to the P semiconductor substrate 201.

Figure 4:
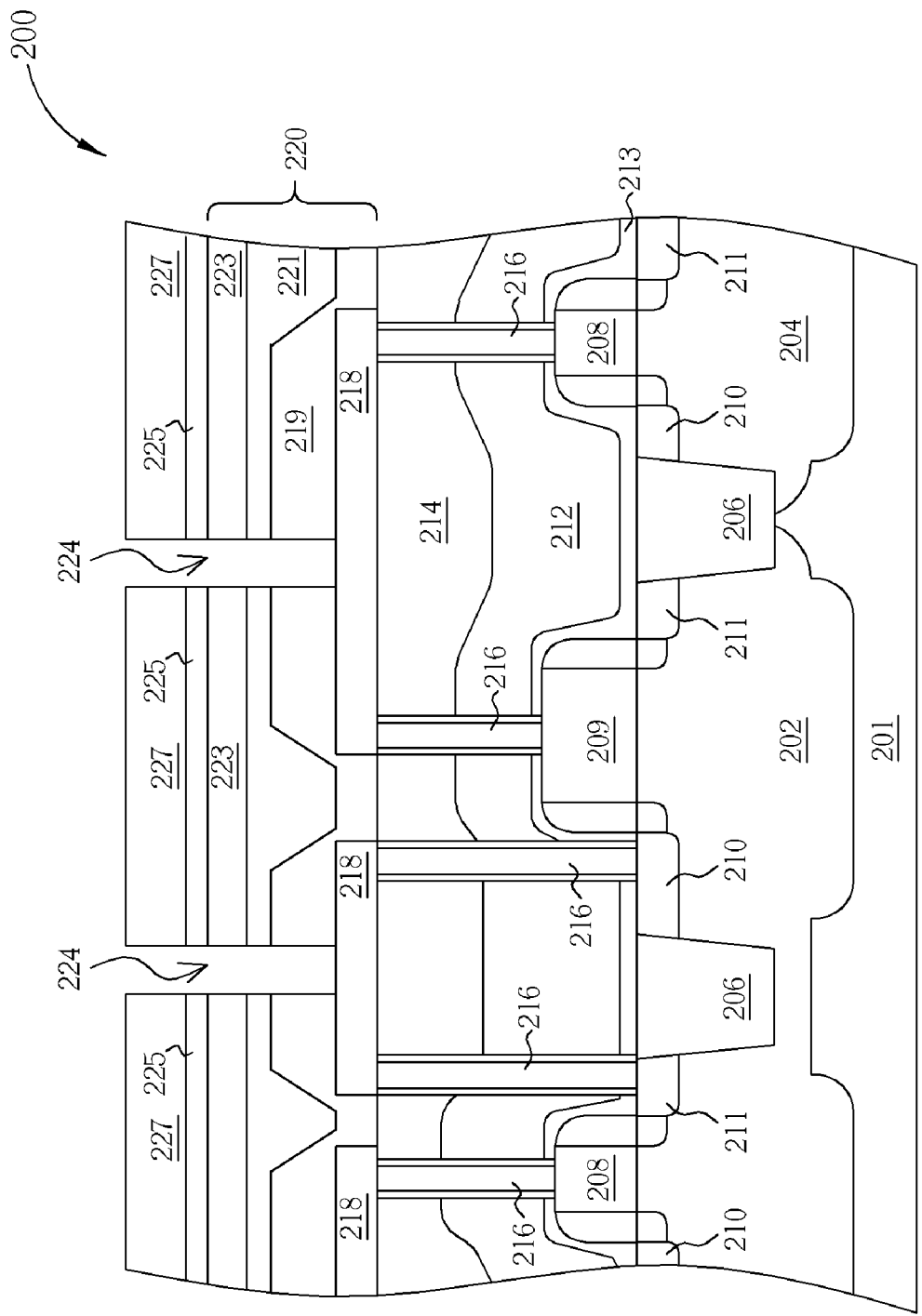
FIG. 4 is a diagram of via hole etching process of the other embodiment of the present invention.

It deserves to be mentioned that the conductive mask 215, 222 in the present invention not only could be made by the conductive photoresist, but also could be made by a structure of a photoresist covers a metal layer. For example, please refer to FIG. 4. FIG. 4 is a diagram of via hole etching process of the other embodiment of the present invention. As FIG. 4 shows, the dielectric layer 220 is doped, dopes the structure of a pattern photoresist 227 covers a metal layer 225 to define the via hole 224 on the dielectric layer 220. The structure of a pattern photoresist 227 covers a metal layer 225 could be the pattern conductive mask 222. And the structure of a pattern photoresist 227 covers a metal layer 225 is covered the edge of the semiconductor wafer 200 to contact with the P semiconductor substrate 201. The pattern photoresist 227 is an etching mask for etching the metal layer 225 and the dielectric layer 220 to form each via hole 224. Or uses two-step pattern transfer process, the pattern photoresist 227 is an etching mask to etch the metal layer 225 to transfer the pattern of the photoresist 227 to the metal layer 225. Then, removes the photoresist 227. And the pattern metal layer 225 is an etching mask for the via hole 224 dry etching process.

In the present invention, the pattern conductive mask 215, 222 are the etching mask for the contact hole 217, the via hole 224 or the trench of the single damascene opening. The charges formed by the plasma dry etching process could disperse uniformly on the conductive mask 215, 222, not be stored on the PSG 214, USG 212, CESL 213, and the dielectric layer 220. And the pattern conductive mask 215, 222 are contacted with the P semiconductor substrate 201, so the dry etching process charges can transmit to the P semiconductor substrate 201. Because the charges are not be stored in the partial area in the dielectric layer. When it etches till or almost till the metal layer and the elements under the dielectric layer, the metal layer and the elements will not burst, not like the prior art. Otherwise, the structure of the photoresist covers the metal mask could select special metal material for providing for other functions. For example, the conductive mask 222 is made by the TiN or TaN. That could avoid the metal burst, and could increase defect and particle inspect rate of the dielectric layer 220 measure line for KLA-Tencor AIT type wafer (for example, residues and micro scratch). And, it could be the via hole 224 plug CMP stop layer, and be removed in the metal plug CMP process.

Figure 5:
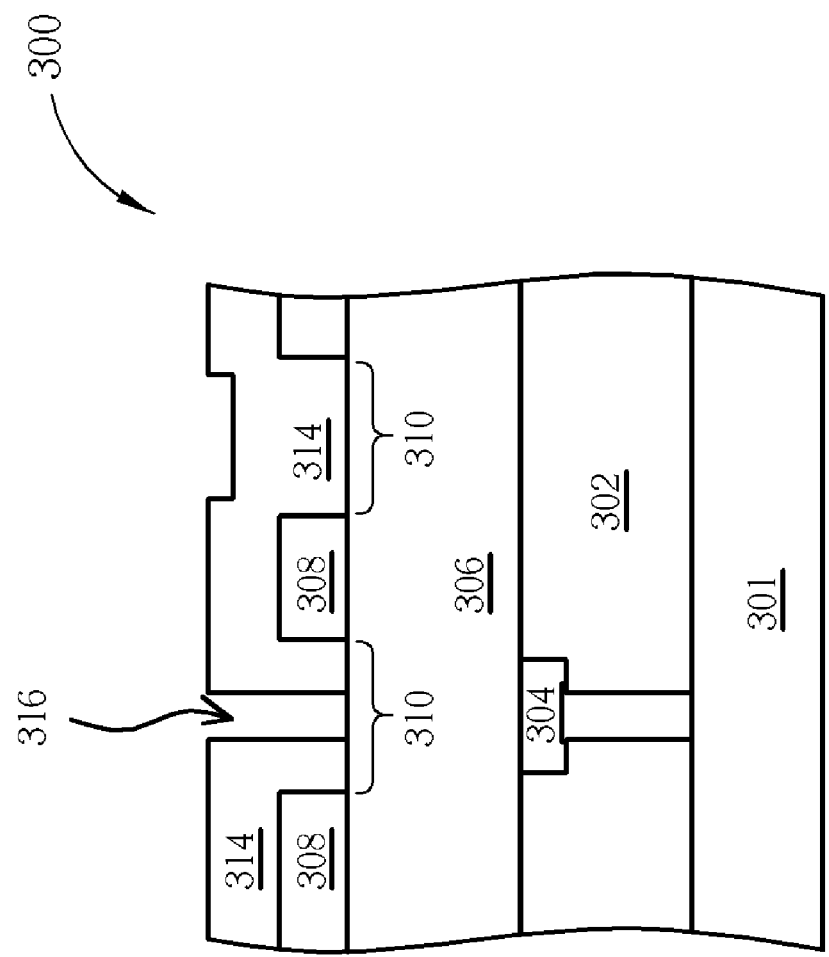
FIG. 5 is a diagram of the dual damascene process in the present invention.

Besides, the present invention could apply with the single damascene or dual damascene of the copper process to from the copper via plug and the copper line. Please refer to FIG. 5. FIG. 5 is a diagram of the dual damascene process in the present invention. A transistor 300 comprises a substrate 301, a dielectric layer 302, at least one conductive structure like a metal plug or a metal pattern, a conductive line 304 etc. in the dielectric layer 302. A dielectric layer 306, a pattern dielectric layer 308 are doped on the dielectric layer 302 and the conductive line 304. The pattern dielectric layer 308 could be a PE oxide made by PECVD. A plurality of opening 310 is made by PEP with a photoresist layer (not shown) to define the copper line of the multilevel interconnects. Then, the dielectric layer 306, 308 is covered a pattern conductive mask 314, and the pattern conductive mask 314 is covered the edge of the semiconductor wafer 300 to contact with the substrate 301. The pattern conductive mask 314 has at least one opening 316 to define the copper via plug of the multilevel interconnects. After dry etching process, a via hole (not shown) is made on the dielectric layer 306. Then, removes the pattern conductive mask 314, and uses the pattern dielectric layer 308 to etch, the trench (not shown) could be made in the dielectric layer 306. Finally, forms a copper via plug and a copper line in the opening of the dual damascene in the same time. And the trench first, via first, and no etching stop layer of the dual damascene are similar. The trench mask and the via mask could be used the conductive mask of the present invention to define the pattern and no metal burst problem. It needn't be mentioned.

Because the material of the conductive mask 314 could be the conductive photoresist on the dielectric layer 306, 308 for big area cover, and the conductive mask 314 is contacted with the substrate 301. When the dry etch process is processed, the charges will not be stored in the etched dielectric layer 306, 308, but be dispersed in big area conductive photoresist and be transmitted to the substrate 301. When it etches till or almost till the conductive line 304, the metal will not burst.

Of course, as the above-mentioned, in the embodiment, the conductive mask 314 could be a structure of a photoresist covers a metal layer. That means after the opening 310 is made, the metal layer and the photoresist for being the conductive mask. Patterns the metal layer and the photoresist, the via hole dry etching process is processed. Of course, the photoresist could chosen to be removed or stayed before via hole dry etching process.

The present invention also could apply with the single damascene. That means the via hole or the trench opening is made by PEP with the conductive mask, then, the opening of the metal layer in the dielectric is made by PEP with the conductive mask, the copper is doped to form the copper plug or the copper line. Because the charges contact with the big area conductive mask, the charges will not be stored, when etches till the dielectric layer, the metal will not burst.

In the prior art, the charges will be stored, when etches the dielectric layer till the metal plug, the conductive line, the ion doped area or the gate components, the metal will burst, the gate dielectric layer will breakdown, the quality and the yield decrease. And the product number decreases serious. The present invention uses the conductive mask, the charges disperse in the big area conductive mask and are transmitted to the substrate, not store in the etched area of the dielectric layer, the metal of the multilevel interconnects and the component will not burst. The wafer yield increases. The conductive mask could be made the conductive photoresist to avoid the metal burst. The present invention could use the structure of the photoresist layer covers the metal layer, and a special metal material for the metal layer. It could increase defect and particle inspect rate of the dielectric layer measure line for KLA-Tencor AIT type wafer (for example, residues and micro scratch). And, it could be the via hole plug CMP stop layer, and be removed in the metal plug CMP process to simply the manufacture and decrease the cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of etching a dielectric layer, the dielectric layer being on a substrate, the method comprising forming a conductive photoresist directly on the dielectric layer, and the conductive photoresist physically contacting with the substrate, processing a dry etching process on the dielectric layer by the conductive photoresist, wherein the dry etching process charges being transmitted to the substrate by the conductive photoresist.

2. The method of claim 1, wherein the dry etching process comprises a contact hole etching process, a via hole etching process, and a single damascene opening etching process.

3. The method of claim 2, wherein the conductive photoresist for define the contact hole, the via hole, and a position of the single damascene opening.

4. The method of claim 3, wherein the conductive photoresist comprises:
   a conductive resin;
   a solvent; and
   a sensitizer.

5. The method of claim 4, wherein the conductive resin comprises a 3-hexyl-thiophene-3thiophene-ethane-methacrylate copolymer.

6. The method of claim 4, wherein the solvent comprises an aceto-nitrile solution of gold chloride.

7. The method of claim 4, wherein the sensitizer comprises a gold chloride.

8. The method of claim 2, wherein the conductive photoresist comprises a structure of a photoresist layer covers a metal layer to define the via hole of the dielectric layer.

9. The method of claim 8, wherein the metal layer comprises a TiN.

10. The method of claim 8, wherein the conductive photoresist further comprises an anti reflective coating (ARC) between the metal layer and the photoresist layer.

11. The method of claim 1, wherein the conductive photoresist is contacted with the substrate edge.

12. A method of forming a contact hole comprising:
   providing a substrate, at least a component on the substrate;
   forming a dielectric layer on the component and the substrate;
   forming a conductive photoresist directly on the dielectric layer to physically contact with the substrate; and
   processing an etching process with the conductive photoresist to etch a contact hole in the dielectric layer till the component surface, wherein the etching process charges being transmitted to the substrate by the conductive photoresist.

13. The method of claim 12, wherein the component comprises a gate and a dopant domain.

14. The method of claim 12, wherein the conductive photoresist is a pattern conductive photoresist comprises a conductive resin, a solvent, a sensitizer to define the contact hole in the dielectric layer.

15. The method of claim 14, wherein the pattern conductive photoresist comprises a structure of a photoresist layer covers a metal layer to define the via hole of the dielectric layer.

16. The method of claim 15, wherein the metal layer comprises a TiN.

17. The method of claim 15, wherein the pattern conductive photoresist further comprises an anti reflective coating (ARC) between the metal layer and the photoresist layer.

18. The method of claim 14, wherein the pattern conductive photoresist is contacted with the substrate edge.

19. A method of forming a via hole comprising:
  providing a substrate, a first dielectric layer on the substrate, at least one multilevel interconnects layer;
  forming a second dielectric layer on the multilevel interconnects layer and the first dielectric layer;
  forming a conductive photoresist directly on the second dielectric layer to physically contact with the substrate, and
  processing an etching process by the conductive photoresist to etch at least a via hole in the second dielectric layer till the multilevel interconnects layer surface, wherein the etching process charges being transmitted to the substrate by the conductive photoresist.

20. The method of claim 19, wherein the conductive photoresist comprises a conductive resin, a solvent, a sensitizer to define the via hole in the second dielectric layer.

21. The method of claim 19, wherein the conductive photoresist comprises a structure of a photoresist layer covers a metal layer to define the via hole in the second dielectric layer.

22. The method of claim 21, wherein the metal layer comprises a TiN.

23. The method of claim 21, wherein the conductive photoresist further comprises an anti reflect coating between the metal layer and the photoresist layer.

24. The method of claim 19, wherein the conductive photoresist is contacted with the substrate edge.

25. A damascene method comprising:
  providing a substrate, at least one conductive line on the substrate;
  forming a dielectric layer on the conductive line;
  forming a conductive photoresist directly on the dielectric layer to physically contact with the substrate;
  processing an etching process by the conductive photoresist to form at least one opening in the dielectric layer till the conductive line surface, the etching process charges being transmitted to the substrate by the conductive photoresist; and
  filling a copper into the opening.

26. The method of claim 25, wherein the conductive line is a contact plug, and the opening is a single damascene opening.

27. The method of claim 25, wherein the conductive line is a multilevel interconnects, and the opening is a dual damascene opening.

28. The method of claim 25, wherein the conductive photoresist comprises a conductive resin, a solvent, a sensitizer to define the opening in the dielectric layer.

29. The method of claim 28, wherein the conductive resin comprises a 3-hexyl-thiophene-3thiophene-ethane-methacrylate copolymer.

30. The method of claim 28, wherein the solvent comprises an aceto-nitrile solution of gold chloride.

31. The method of claim 28, wherein the sensitizer comprises a gold chloride.

32. The method of claim 25, wherein the conductive photoresist is contacted with the substrate edge.

* * * * *